(12) United States Patent
Schröder et al.

(10) Patent No.: US 9,408,280 B2
(45) Date of Patent: Aug. 2, 2016

(54) LIGHTING SYSTEMS

(75) Inventors: Helmut Schröder, Wiesbaden (DE); Daniel Brand, Pulheim (DE)

(73) Assignee: SCHREDER, Brussels (BE)

( * ) Notice: Subject to any disclaimer, the term of this patent is extended or adjusted under 35 U.S.C. 154(b) by 452 days.

(21) Appl. No.: 13/468,389

(22) Filed: May 10, 2012

(65) Prior Publication Data

US 2012/0286770 A1 Nov. 15, 2012

Related U.S. Application Data

(60) Provisional application No. 61/485,083, filed on May 11, 2011.

(51) Int. Cl.
*G01R 19/00* (2006.01)
*H05B 37/02* (2006.01)
*G01R 22/06* (2006.01)
*G01R 19/25* (2006.01)
*G01R 21/00* (2006.01)
*G01R 21/133* (2006.01)

(52) U.S. Cl.
CPC ............ *H05B 37/0272* (2013.01); *G01R 19/00* (2013.01); *G01R 19/2516* (2013.01); *G01R 21/00* (2013.01); *G01R 21/133* (2013.01); *G01R 22/061* (2013.01); *Y02B 20/72* (2013.01)

(58) Field of Classification Search
CPC .. G01R 22/061; G01R 19/2516; G01R 19/00; G01R 21/133; G01R 19/2513; G01R 21/00; G01R 22/10; G06F 1/26
USPC ........................................................ 324/113
See application file for complete search history.

(56) References Cited

U.S. PATENT DOCUMENTS

| | | | | |
|---|---|---|---|---|
| 7,391,335 B2* | 6/2008 | Mubaslat | ........... | G01R 31/2635 315/224 |
| 7,529,594 B2* | 5/2009 | Walters | ................ | G06Q 30/04 700/17 |
| 7,546,167 B2* | 6/2009 | Walters | ................ | G06Q 30/04 700/17 |
| 7,911,359 B2* | 3/2011 | Walters | ................ | G06Q 30/04 340/870.11 |
| 8,543,249 B2* | 9/2013 | Chemel | ............. | H05B 37/0272 351/51 |
| 8,552,664 B2* | 10/2013 | Chemel | ............. | H05B 37/0245 315/291 |
| 8,593,135 B2* | 11/2013 | Chemel | ................ | H05B 37/029 324/105 |
| 8,604,712 B2* | 12/2013 | Bloom | ................. | H05B 33/089 315/155 |
| 2010/0026187 A1* | 2/2010 | Kelly | ...................... | A47F 11/10 315/113 |
| 2010/0149815 A1* | 6/2010 | Erchak | ...................... | F21S 2/00 362/293 |
| 2010/0296285 A1* | 11/2010 | Chemel | ................... | F21S 2/005 362/235 |
| 2010/0301834 A1* | 12/2010 | Chemel | ................ | H05B 37/029 324/105 |
| 2010/0324845 A1* | 12/2010 | Spanier | ............. | G01R 19/2513 702/62 |
| 2012/0286770 A1* | 11/2012 | Schroder | ............ | H05B 37/0272 324/113 |

OTHER PUBLICATIONS

ZigBee/IEEE 802.15.4 Summary, Sep. 10, 2004, pp. 1-35.

* cited by examiner

*Primary Examiner* — Jermele M Hollington
*Assistant Examiner* — Christopher McAndrew
(74) *Attorney, Agent, or Firm* — Buchanan Ingersoll & Rooney PC (57) ABSTRACT

A lighting system is disclosed having a plurality of luminaires in which the energy usage of each luminaire can individually be metered using a luminaire controller having a metering circuit.

15 Claims, 4 Drawing Sheets

LIGHTING SYSTEMS

RELATED APPLICATIONS

The present application claims the priority of U.S. Provisional Application Ser. No. 61/485,083 filed on May 11, 2011 and entitled "Lighting Unit Apparatus, Process, and Article of Manufacture", which is incorporated by reference herein in its entirety.

FIELD

Improvements in or relating to lighting systems, are disclosed such as, although not exclusively, street lighting systems having energy metering functionality.

BACKGROUND INFORMATION

Street lighting systems may comprise a plurality of ballast lamps or light-emitting diode (LED) based luminaires. Such street lighting systems can be controlled to be turned on and turned off in accordance with the length of night and day. Such control can be provided by a simple clock or can be provided by a sensor-based system which senses the amount of ambient light and effectively switches the lighting system ON and OFF when the ambient light falls below or exceeds a predetermined threshold value.

Whilst it is known that utility companies providing street lighting systems can determine their energy usage for entire systems to within 10% of the actual metered energy usage. This means that the value of the metered energy is not accurate, with large over- and under-estimations being made of the actual energy consumed. Moreover, the metered energy of individual elements, for example, for each luminaire, within the lighting system cannot be determined.

SUMMARY

In accordance with a first exemplary aspect, there is provided a metering circuit for a luminaire connectable between a mains supply and a luminaire, the metering circuit comprising: a voltage measurement circuit providing a voltage output signal; a current measurement circuit providing a current output signal; and a processor connected to the voltage and current measurement circuits to receive the voltage and current output signals, and to provide signals representative of parameters associated with the voltage and current output signals.

In accordance with another exemplary aspect, there is provided a luminaire controller comprising:
a mains input module connectable to a mains supply;
a metering circuit connected to the mains input module for measuring parameters of the mains supply input to the mains input module and for providing output signals indicative of the measured parameters, the measured parameters being indicative of energy consumption of a luminaire with which the luminaire controller is associated and of the luminaire controller itself; and
a central processing module connected to receive the output signals indicative of the measured parameters and for providing metered values of the mains supply connected to the mains input module.

In accordance with a further exemplary aspect, there is provided an energy metered lighting system comprising:
at least one luminaire;
a luminaire controller for controlling operation of each luminaire, each luminaire controller comprising:
a mains input module connectable to a mains supply;
a metering circuit connected to the mains input module for measuring parameters of the mains supply input to the mains input module and for providing output signals indicative of the measured parameters, the measured parameters being indicative of energy consumption of a luminaire with which the luminaire controller is associated and of the luminaire controller itself;
a central processing module connected to receive the output signals indicative of the measured parameters and for providing metered values of the mains supply connected to the mains input module; and
a communications module connected to the central processing module, the communications module being operable for receiving the metered values from the central processing module; and
a management system being wirelessly connectable to each luminaire controller for receiving the metered values, the communications module being operable for transmitting the metered values to the management system, the management system including a memory for storing the received metered values.

BRIEF DESCRIPTION OF THE DRAWINGS

For a better understanding of the present invention, reference will now be made, by way of example only, to the accompanying drawings in which.

DETAILED DESCRIPTION

The present invention will be described with respect to exemplary embodiments, and with reference to certain drawings, but the invention is not limited thereto. The drawings described are only schematic and are non-limiting. In the drawings, the size of some of the elements may be exaggerated and not drawn on scale for illustrative purposes.

A metering circuit is disclosed which can provide more accurate measurement of the energy consumption of an associated luminaire within a lighting system.

A luminaire controller including at least one energy metering circuit is also disclosed.

A lighting system as disclosed herein can include metered energy values provided for each luminaire within the system.

A processor may include a power supply connected to the processor for providing power.

In an exemplary embodiment of the present disclosure, the metering circuit is implemented as an integrated circuit.

In an embodiment, the luminaire controller comprises a memory for storing the metered values.

In another embodiment, the luminaire controller comprises a communications module connected to the central processing module, the communications module being operable for receiving the metered values from the central processing module and for transmitting the metered values to a remote location. It can be preferred that the communications module comprises a wireless communications module, and in particular, the wireless communications module operates in accordance with ZigBee protocol.

A power supply module can be provided for supplying power control signals to the associated luminaire.

A metering circuit of the luminaire controller may comprise a voltage measurement module and a current measurement module, the measured parameters comprising respective voltage and current output signals. The metering circuit may comprise a processor connected to the voltage and current measurement circuits to receive the voltage and current output signals, and to provide signals representative of parameters derived from the voltage and current output signals.

Each luminaire controller may be wirelessly connected to a segment controller for transmitting the metered values thereto, the segment controller being operable for collecting metered values from all luminaire controllers within its segment and for transmitting the collected metered values to a management system.

In an exemplary embodiment, the energy metered lighting system may further comprise a web-based interface connectable to the management system via an internet connection, the web-based interface being operable for providing user access to the management system and for obtaining information relating to the lighting system therefrom.

It will be understood that the terms "vertical" and "horizontal" are used herein refer to particular orientations of the Figures and these terms are not limitations to the specific embodiments described herein.

A lighting system can include one or more lighting units, each lighting unit comprising one or more electric lamps, for example, at least one light-emitting diode (LED) with associated parts and wiring. Such an electric lamp is known as a luminaire and can be used for outdoor lighting applications. For example, a luminaire comprises an array of LED elements mounted in a housing or fixture together with an LED driver for controlling the operation of the LED elements.

A lighting system as disclosed herein comprise a telemanagement system for monitoring, controlling, metering and managing outdoor lighting. The system is based on open technologies and has benefits in that it saves energy, reduces greenhouse gas emissions, improves outdoor lighting reliability and lowers maintenance costs. The lighting system is operated and controlled by means of the internet.

Each individual lighting point within the system can be switched on/off in accordance with periods of night and day, or dimmed at any time. Status reports are provided in respect of operating state, energy consumption and failures, these reports being reported and stored in a database with exact timestamp and geographical location information. The system ensures that the right lighting level is provided on the streets whilst improving reliability of outdoor lighting and reducing operating costs.

The lighting system comprises the following basic units:
  (i) a central management system including a database and web servers providing connection to the internet;
  (ii) a plurality of lighting units, for example, LED-powered luminaires arranged in an area to be lit;
  (iii) a plurality of outdoor luminaire controllers (OLCs), which may be implemented as either a luminaire controller or a column controller, each luminaire controller and column controller being referred to hereinafter as a "LuCo" device and a "CoCo" device respectively;
  (iv) at least one segment controller, each segment controller being referred to hereinafter as a "SeCo" device;
  (v) a ZigBee network; and
  (vi) a web interface connectable to the central management system and each SeCo device via an internet connection.

It will be appreciated that if a SeCo device is not utilised in the system, each OLC can act as a SeCo device and transfer their metering data directly to the management system via a suitable internet connection.

By having a lighting application system which can be controlled using a web-based application, the system can be monitored, controlled and managed from any suitable locality without the need for the presence in the vicinity of the lighting application. In this way, a core element to the lighting system is the open communication protocol ZigBee which utilises a wireless mesh networking technology widely used in various industries where a secure, reliable and industry-standard based networking technology is needed, for example, IEEE 802.15.4. By using ZigBee interfaces, mesh functionality can be provided where every light column becomes a router to transport data if needed. In addition, the system can permanently decide to use the best of 16 communication channels together with authentication and secure data transport to ensure the best use of the available bandwidth.

ZigBee is a trademark of the ZigBee Alliance which provides a specification for a suite of high level communication protocols using small, low-power digital radios based on an IEEE 802 standard for personal area networks. ZigBee is particularly useful in radio frequency (RF) applications where low data rates, long battery life and secure networking are required, and where periodic or intermittent data transmission or a single signal transmission is required from a sensor or other input device.

Frequency bands may be utilized that minimize communication degradation due to losses, for example, ZigBee on IEEE 802.15.4 in the 2.4 GHz to 2.4835 GHz band, the Industrial Scientific and Medical (ISM) band.

The OLCs may be implemented as either LuCo or CoCo devices which share reliable communication, switching and dimming capabilities, as well as the ability to detect lamp failure. Each OLC is ballast independent and support conventional lighting systems such as magnetic ballasts and bi-power ballasts, as well as electronic ballasts and LED drivers operating with either an analog protocol, for example, '0-10V', or a digital protocol, for example, digital addressable lighting interface (DALI). Each OLC is capable of switching a 1 kW load at 230V.

DALI is a technical standard for network-based systems for controlling lighting in buildings. It was established as a successor to '0-10V' lighting control systems, but both systems are still currently used. DALI is an open standard which is an alternative to digital signal interface (DSI) on which it is based. The DALI standard also incorporates a communications protocol and electrical interface for lighting control networks.

A known DALI network comprises a controller and one or more lighting devices, for example, electrical ballasts and dimmers, each lighting device having a DALI interface. The controller monitors and controls each lighting device by means of a bi-directional data connection. The DALI protocol allows lighting devices to be individually addressed as well as to be addressed in groups.

In a DALI network, each lighting device is assigned a unique static address in the numeric range from 0 to 63 making it possible to have 64 devices in a standalone system. Alternatively, DALI can be used as a subsystem via DALI gateways to address more than 64 devices. Data is transferred between the controller and each device by means of an asynchronous, half-duplex, serial protocol over a two-wire differential bus with a fixed data transfer rate, typically of 1200 bits per second. The network may be arranged in a bus or star topology or a combination thereof. As the DALI system is not classified as being separated extra low voltage (SELV), it can be run next to mains cables or within a multi-core cable that includes mains power. Data is transmitted using Manchester encoding (also known as phase encoding) and has a high signal-to-noise ratio which enables reliable communication in the presence of a large amount of electrical noise.

In accordance with an exemplary embodiment, energy saving can be obtained through optimized start/stop and a constant lumen output (CLO) strategy which ensures that the required illumination is provided over a period of time. A maintenance factor (MF) is utilized for taking into account the reduction of luminous flux with age. An exemplary MF is 0.8 which indicates that the light output of 100% will depreciate to 80% at the end of the predetermined service time for the system. It is to be noted that newly installed lamps emit more light than is required to ensure that the lighting levels at the next service cycle do not fall below the required minimum value. Exemplary energy savings between 8% and 10% can be achieved depending on the particular lighting installation.

The CLO strategy includes an intelligent algorithm that makes the electrical power output more effective regarding aging lamps and luminaires. In accordance with exemplary embodiments, it is possible to have just the desired constant light level over years. A lighting system manager can configure and change dimming profiles easily to reduce the light level in times of less traffic or other conditions. The term "dimming profile" refers to light levels provided by a lamp over a 24-hour period, and can be optimized for a particular location or application.

When designing a street lighting application, various factors need to be considered, for example, the desired lighting level, the light pole spacing and the illuminance uniformity ratio. Each of these factors should be considered when determining the lamp power needed. The term "lamp" as used herein is a generic term and refers to any lighting element used in a street lighting application including luminaires, and in particular, LED luminaires.

Lamps used in outdoor lighting applications tend to be available in a range of fixed wattage values, for example, 50 W, 70 W, 100 W, 150 W, 250 W etc. During the design phase, if it is desired to have a lamp wattage value that falls between the fixed wattage values, the lamp wattage value is chosen as the next higher lamp wattage value, that is, if lamp wattage values of 120 W are needed, lamps having wattage values of 150 W are chosen. This means that there is over-lighting in that particular lighting application and energy is wasted.

In accordance with lighting systems disclosed herein, compensation can be made for over-lighting by dimming the over-powered lamp to avoid over-lighting and to avoid wasting energy. For example, if a wattage value of 150 W is used as described above; the lamp can be dimmed to provide the desired output wattage value of 120 W. This is referred to as virtual power output (VPO) and energy savings of up to 25% can be made in accordance with the particular lighting application.

Further energy savings can be made by defining dimming profiles to save energy during periods of low traffic, for example, during late night hours. By using a selective dynamic lumen output (SDLO), exemplary energy savings of between 30% and 40% can be made.

Figure 1:
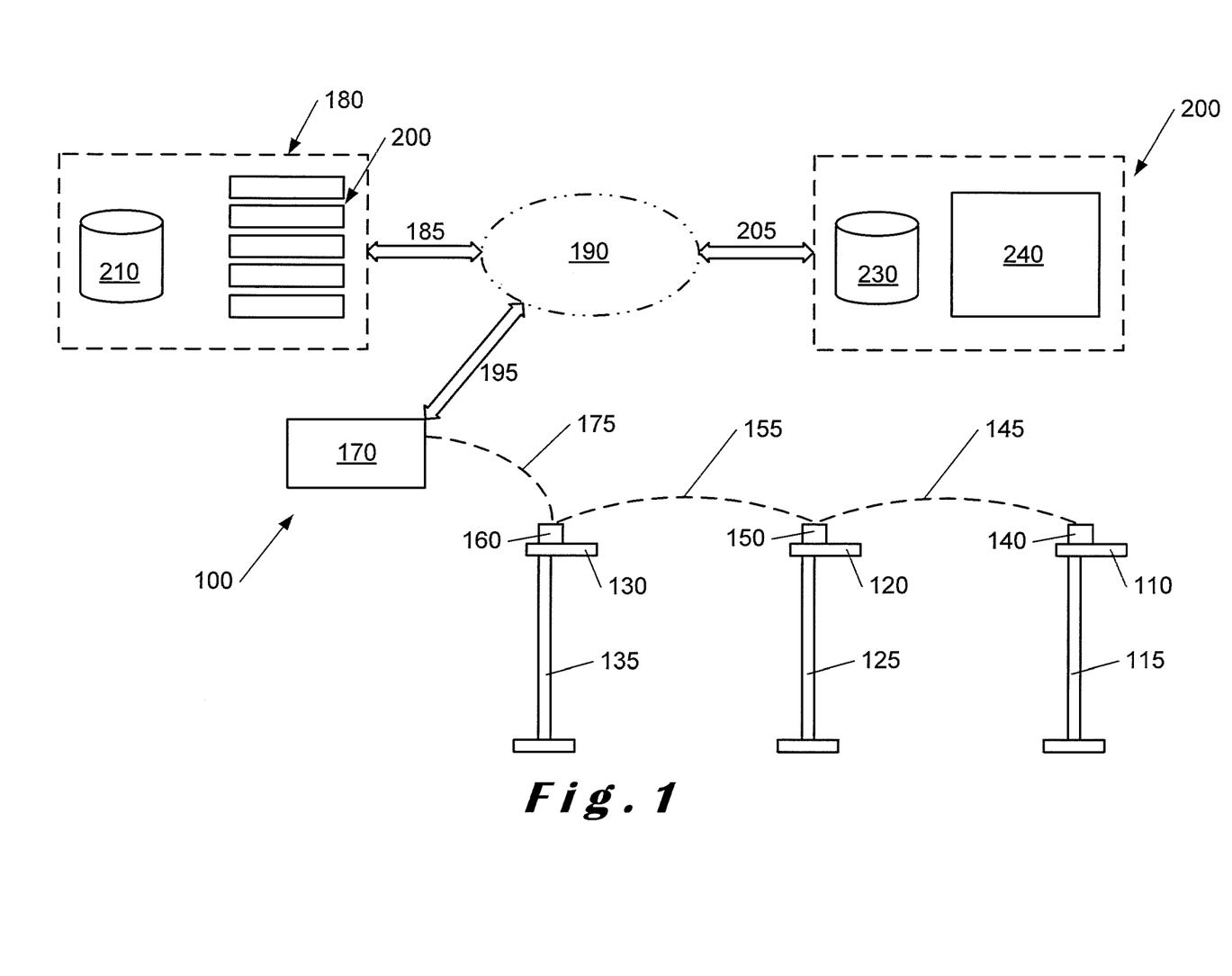
FIG. 1 illustrates a schematic diagram of an exemplary lighting system as disclosed herein.

Referring initially to FIG. 1, an exemplary lighting system 100 in accordance with the present disclosure is shown. As shown, the lighting system 100 comprises a plurality of luminaires 110, 120, 130, each being mounted on a respective column or pole 115, 125, 135.

Each luminaire 110, 120, 130 also includes a wireless ZigBee interface 140, 150, 160. The wireless ZigBee interface 140, 150, 160 of each luminaire 110, 120, 130 forms a part of a wireless ZigBee mesh network as indicated by dotted lines 145, 155 between adjacent luminaires 110, 120, 130 and with a SeCo device 170 as shown by dotted line 175. The SeCo device 170 is connected to a central management system 180 via an internet connection 190 and to a user interface (UI) or web browser 200 as indicated by block arrow 195 between the SeCo device 170 and the internet connection 190; block arrow 185 between the central management system 180 and the internet connection 190; and block arrow 205 between the UI 200 and the internet connection 190.

The central management system 180 includes a database 210 and web services 220. The UI 200 includes a server 230 and an interactive display 240. The UI or web browser 200 may be implemented by any suitable computing device, such as, a PC or a portable device, for example, a cellular phone or other smart device that can be connected to the internet 190.

Figure 2:
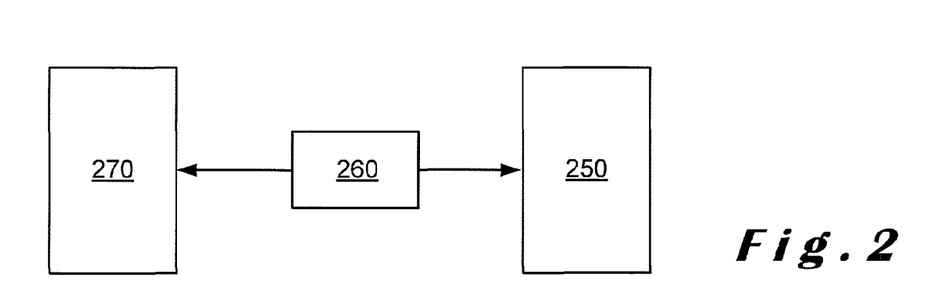
FIG. 2 illustrates a block diagram of elements of an exemplary luminaire forming a part of the lighting system shown in FIG. 1.

Each luminaire 110, 120, 130 comprises an OLC 250, an LED driver 260 and an LED array or LED engine 270 as shown in FIG. 2. The OLC 250 may be implemented as either a CoCo device, or a LuCo device as will be described in more detail below with reference to FIGS. 3 and 4.

Each OLC 250 within each luminaire 110, 120, 130 communicates with the SeCo device 170, either directly or indirectly through at least one other OLC 250. Communication between OLCs 250 and the SeCo device 170 is provided by a wireless network such as a mobile telecommunications network or a virtual private network (VPN).

The SeCo device can be considered to be "middleware", collecting and storing data from the "field level", that is, the OLCs, until the central management system requests that the data be transmitted for upload into the database 210. The data may be stored in a non-volatile memory (NVM) provided in the SeCo device.

Although the wireless interfaces 140, 150, 160 are shown on the top and outside of their respective luminaires 110, 120, 130, this is for ease of explanation, and, it will readily be understood that these interfaces 140, 150, 160 are normally housed within the luminaire itself. In some luminaires, the wireless interfaces may be mounted within the luminaire controller of the respective luminaire. It will also be appreciated that the luminaire controller may be mounted outside the luminaire if it incorporates a photocell for sensing ambient light conditions.

A lighting unit may include a metering circuit which cooperates with the OLC, and if desired, may include switching to turn the lights ON and OFF and/or include a dimmer which dims the lighting levels in between the ON and OFF levels. Such a dimmer may be utilized, for example, in response to weather, energy conservation, external communication etc. The lighting units may include, or can be associated with, a communication device, for example, a transceiver and antenna arrangement. One communication device is provided for each lighting unit which facilitates communication with a network hosted by a server or other computer system.

In one embodiment, a group of lighting units communicate with one another in a segment. A segment may include between 50 and 100 lighting units with one or more segments layered between individual lighting units and the server of computer system. Each segment can be configured to facilitate the coordination of lighting units, and, in some cases, with communication between individual lighting units within the segment. Each lighting unit via its associated SeCo device 170 can communicate with the central management system 180, such communication may be bi-directional.

Therefore, in accordance with the present disclosure, the lighting system can provide both control, in controller circuitry, as well as measurement, in metering circuitry, of actual power usage. The measured data can be communicated and processed through the system to report to a utility company so as to obtain a utility bill based on measured current usage rather than on assumptions, such as, measured voltage multiplied by a power factor. The actual usage data can be obtained luminaire-by-luminaire by the associated metering circuit, which cooperates with the control circuit, gathering data that is fed up through the system for incorporation into a report. The report can be sent electronically to the utility company, and an invoice for actual use of the electricity by the luminaires in the system is received back from the utility company.

The metering circuit may cooperate with a controller or may be combined in the controller itself to provide a combined metering and control system for the luminaire. Such a controller can be adapted to include a dimming capability, for example, via a signal to adjust the power and/or voltage for the LED driver to alter the output power of the LED array.

A high redundancy of features is implemented at the controller level, for example, a built-in astronomical clock takes control when there is no SeCo device installed in the system, so that the light will switch ON in the evening and OFF in the morning. This provides confidence that light is provided at night-time whilst the entire lighting system is being implemented.

The management system can support network time protocol (NTP) so that all clocks within the system can be synchronized, for example, the astronomical clocks within the OLCs.

Lightning protection is provided as the controller meets the same rigorous regulations which exist for energy metering devices in the domestic market. Both the LuCo device and the CoCo device can be connected directly to an electricity power grid and can fulfil surge protection specifications relating to metering units.

Validation of energy consumption is possible with the configuration of a high and low limit of expected consumption. Any unexpected increase in consumption is just as apparent as no consumption, which is an indication of a broken lamp. With dimmable ballasts, the limits are more dynamic to control if the dimming interface is working accurately.

The CoCo device is a pole-mountable device and can be mounted in the base of the column or pole, or at any other suitable location on the column or pole. It includes an external radio/antenna device with a secure power-up feature. It also includes an astronomical clock and it can support two different lighting applications. Time synchronization and daylight saving time can be implemented. A ZigBee router is implemented in the CoCo device and it can also serve as a short term data collector. Three energy meters can be implemented with built-in energy saving features, one energy meter metering the energy used by the LED drivers operating using either the '0-10V' or DALI protocol, and the other two energy meters metering the energy used by associated loads up to 1100 VA.

CoCo devices can be implemented as a fully potted ruggedized version for in-column mounting with up to two independent power switches, each of which can be separately metered. These are particularly useful if more than one load, for example, more than one luminaire, is attached to a mounting column 115, 125, 135 (FIG. 1). This is ideal for implementations where double flamed luminaires (two luminaires on a mounting column) are used, or for festive lighting, advertising signs etc. which may be used in addition to the main luminaire. Energy consumption of each output can be individually metered through accurate meters located within the CoCo device. In addition, the energy consumption of the CoCo device itself is measured and it is not only the energy consumption of the load that is measured. The energy consumption of the CoCo device will also include the energy used by the device when in standby mode, that is, when the associated luminaire is not operating during periods of daylight.

A LuCo device can be a preferred choice for a single luminaire and ballast arrangement. It can be implemented with a DALI interface, with a built-in energy meter or without metering for applications where a common energy meter is mounted elsewhere in the system. This provides the freedom to decide, on a case-by-case basis, the best solution for luminaire control, for example, metering in a mixed power grid and current flow control in applications when a common energy meter is mounted in a feeder pillar.

The LuCo can be mounted either vertically or horizontally and contains a radio transceiver and antenna. It has a secure power-up feature and an astronomical clock. It can support different applications including time synchronization and daylight saving time. A ZigBee router is also provided with a short-term data collector, an energy meter and built-in energy saving features. The LuCo can be mounted within the luminaire housing adjacent the LED engine. In this case, the antenna needs to be tested for correct reception. Alternatively, the antenna can be mounted outside the luminaire housing. Moreover, the LuCo can be mounted at the junction of the luminaire housing and the pole or column on which the luminaire is mounted.

In another embodiment, a luminaire controller known as a "PiCo" device can be mounted on top of the luminaire housing. A "PiCo" device is similar to a LuCo device but includes additional functionality for sensing ambient conditions, for example, ambient lighting levels in the vicinity of the luminaire and ambient temperature conditions within the PiCo device itself. The ambient lighting levels can be used to control dimming of the luminaire with which the PiCo device is associated, and the ambient temperature conditions can be used for temperature compensation of the energy measuring circuit. The PiCo device also provides a dimming capability and includes functionality for operating under either '0-10V' or DALI protocols. A PiCo device is described in more detail in co-pending international (PCT) patent application no. PCT/EP2012/057857 filed on Apr. 27, 2012 entitled "Luminaire Controllers" and which is incorporated herein by reference in its entirety.

Figure 3:
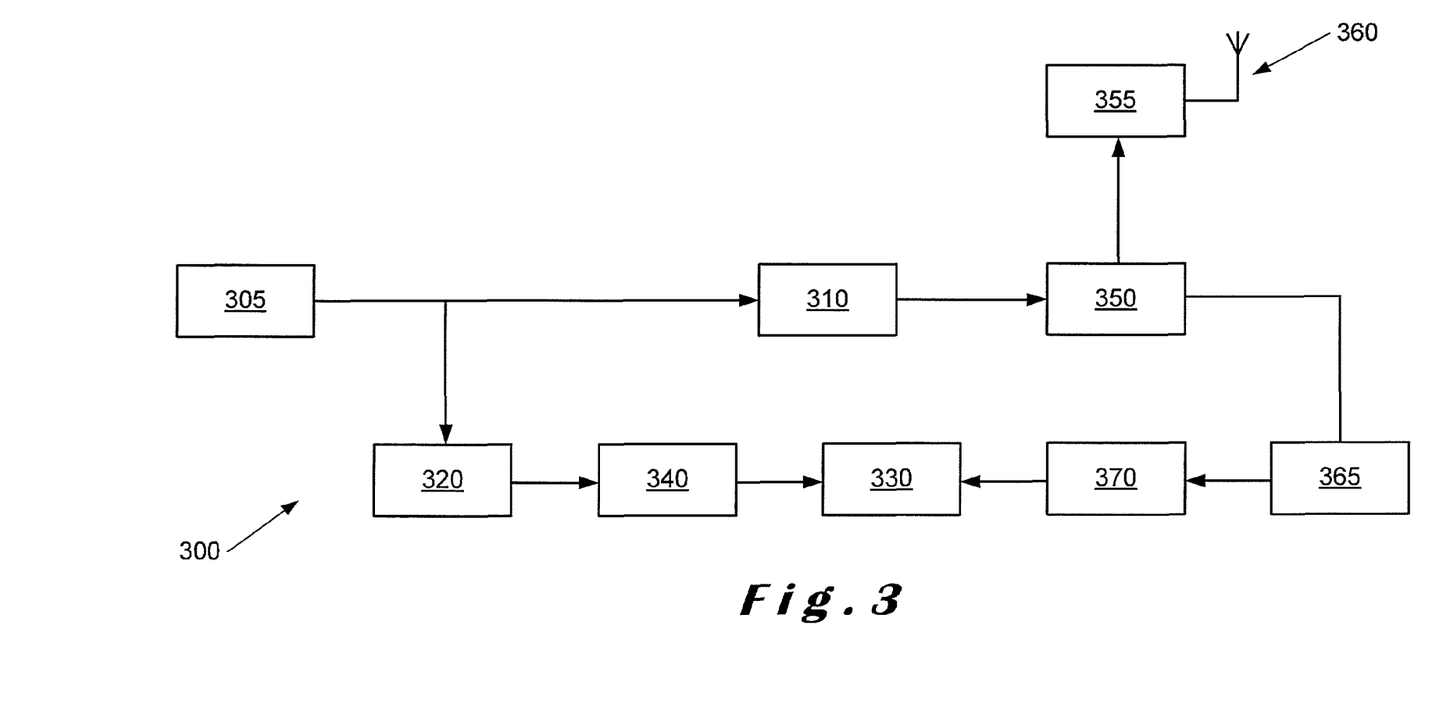
FIG. 3 illustrates a block diagram of an exemplary luminaire controller forming part of the lighting system shown in FIG. 1.

FIG. 3 shows a block diagram of a LuCo device 300. The device 300 includes a mains input power supply 305 which provides power to an internal power supply 310 as well as to a switch 320 and its associated load 330 via a metering circuit 340. The device 300 also includes a controller 350, a ZigBee router 355, an antenna 360, an astronomical clock 365, and a timing circuit 370. The metering circuit 340 will be described in more detail below with reference to FIG. 4.

The ZigBee router 355 comprises a transceiver which is connectable to the ZigBee mesh network via the antenna 360. The astronomical clock 365 provides switching after sunset/before sunrise even when the other elements of the lighting system, for example, the SeCo device or web server, fail to operate. The timing circuit 370 is connected to both the astronomical clock 365 and to load 330 to control operation of the luminaire. The LuCo device 300 continuously monitors and logs data relating current, voltage and power factor as will be described with reference to FIG. 4 below. In addition, the LuCo device 300 also monitors its own energy consumption.

LuCo and CoCo devices are ballast independent devices which support conventional ballasts, for example, magnetic ballasts and bi-power ballasts, as well as, electronic ballasts, and, each device includes LED drivers operating with either DALI or '0-10V' protocols to control the luminaire on which they are mounted. Current voltage and power factor are continuously monitored and logged. In both devices, a metering integrated circuit (IC) or microchip is used for metering both the supply voltage and the current which is supplied to the luminaire and to the LED driver associated with the luminaire, as well as, the energy consumption of the controller device itself. This provides more accuracy as the energy consumption of the controller device and the LED driver can be deducted from the total energy consumption to provide an energy measurement value that corresponds to the luminaire itself. The metering IC may have a sampling rate of approximately 6.4 kHz at 50 Hz and 6.6 kHz at 60 Hz. From the voltage and current waveforms, that is, sine waves, it is possible to determine both active and reactive power as well as the power factor.

It will be appreciated that the metering IC may be located on a printed circuit board (PCB) which includes all the desired wiring and interfaces for the operation of either the CoCo or the LuCo devices. The controller in each case may be located on the SELV side and communicates through an optical coupler providing galvanic isolation, the metering IC using a serial peripheral interface (SPI) bus on the PCB.

Figure 4:
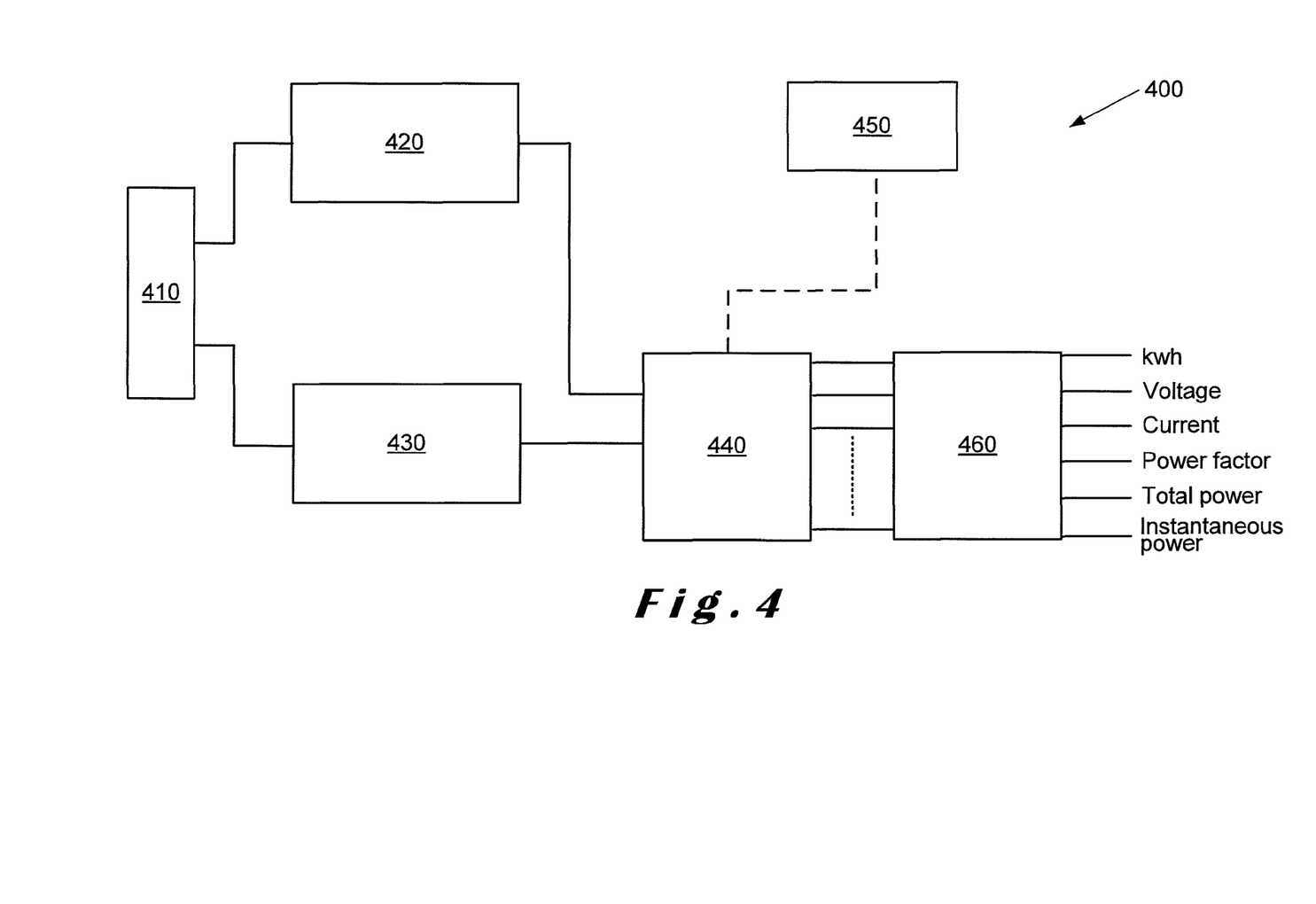
FIG. 4 illustrates a block diagram of an exemplary metering circuit for the luminaire controller of FIG. 3.

FIG. 4 illustrates a metering circuit 400 which comprises input 410 connected to the mains supply of the associated luminaire controller; a current measurement circuit 420 connected to the input 410; a voltage measurement circuit 430 also connected to the input 410; a metering IC 440 having its own power supply 450; and a core processor 460. As shown, the current measurement circuit 420 and the voltage measurement circuit 430 have respective outputs 425, 435 which provide inputs to the metering IC 440. The metering IC 440 provides output signals 445 which form input signals for the core processor 460 as shown. The core processor 460 determines metered parameters indicative of the energy usage, for example, kilowatt-hours (kWh), voltage, current, power factor, total power and instantaneous power. In addition, the metering circuit may provide average voltage, current and power values if such information is desired.

Although not shown, the core processor 460 corresponds to the controller 350, the ZigBee router 355, the antenna 360 of FIG. 3 and therefore has wireless capability for transmitting the metered parameters to the SeCo 170 (FIG. 1) for transmission to the central management system 180 (FIG. 1).

It will be appreciated that the metering circuit 400 may be implemented in both LuCo and CoCo devices, but in the latter case, more than one metering circuit may be required, that is, one for each of the energy meters. In addition, the metering IC may be required to conform to standards set by public utilities commissions, for example, the California Public Utilities Commission (CPUC) who set an accuracy of ±2%.

The CoCo device may be implemented in several versions, for example: (1) as a CoCo "single" where a single supply and a single metering device measuring energy consumption are connected together; (2) as a CoCo "full" where two separate supplies are provided for two loads as described above; and (3) as another CoCo "full" where three meters are provided for measuring controller energy consumption, that is, the energy used by the '0-10V' or DALI interface, as well as, the energy consumption of each of the two load (where both are utilised). These can be implemented in several ways, but as described above, the CoCo device is, for example an in-pole device and is shaped to fit within a pole or column supporting the luminaire itself. As described above, for a two-load embodiment, one supply is provided for the main luminaire and another supply is provided for an additional lighting scheme.

The LuCo device tends to have a single supply and a single metering circuit for measuring the consumption of a load connected to the single supply, for example, the luminaire. In addition, the energy consumption of the controller device is also determined. This means that the total energy which is used by the luminaire and its associated drive circuits including the controller itself can be determined.

As described above, the CoCo and LuCo devices can be configured for use with common international voltages, for example, 120V, 240V and 277V for the North American market; 230V for the European market etc.

Different metering approaches can be implemented. For AC metering: (1) galvanic isolated current transformer where a sampling rate of 6.4 kHz at 50 Hz, or 6.6 kHz at 60 Hz, is implemented for the induced voltage as described above; and (2) shunt resistor where the voltage across this resistor provides an indication of the AC current usage to within 1% of the actual metered current. In the latter case, the shunt resistor can be implemented in a DC configuration. It is also possible to monitor ambient conditions, for example, using a photocell; the light output of one or more luminaires; the current with a transformer or resistor; or any combination thereof.

It will be appreciated that it is possible to modify an existing luminaire to incorporate a LuCo device so that the luminaire becomes part of a lighting system in accordance with the present disclosure. Similarly, the column or pole supporting a luminaire may also be modified to be able to accommodate a CoCo device. Such an existing luminaire may include a photocell, and, information relating to ambient conditions determined by the photocell can be used as part of the control function for the LuCo or CoCo device. Alternatively, the luminaire controller itself may incorporate a photocell which provides additional control functionality, such as, dimming of the luminaire to provide light levels between fully ON and fully OFF.

Apart from sensing ambient conditions to provide control functionality for LuCo or CoCo devices, a photocell may also be used to trigger communication from the LuCo or CoCo device associated with that photocell to another LuCo or CoCo device within the ZigBee mesh network. In addition, a photocell may also be used with a SeCo device operating to control a segment controlled by the SeCo device. For example, an output signal from a photocell may be used to change the light level produced by luminaires within the segment.

In some embodiments, an emergency override may be provided which can either turn on the luminaire(s) within a segment or can switch luminaire(s) already on to a maximum lighting level. Such an emergency override may be controlled by an external sensor which provides the override signal directly to the luminaire(s) or via a central control system for the lighting system as a whole. The lighting levels can be reset to their normal values, for example, using a control signal from the central computer system.

Each luminaire in the lighting system in accordance with the present disclosure can be configured to be remotely monitored for real-time power usage, and is controlled by a wireless communication and management system as described above. The power usage can be controlled using continuous live data connections; on demand or based on a predefined schedule; or using a field-initiated connection request. As described above, the wireless communication comprises a ZigBee based, RF communication interface, but it will be appreciated that any other suitable wireless communication system may be used.

Using wireless communication, each wireless communication module associated with each luminaire can communicate with one another. The wireless communication modules may be arranged for hierarchical communication or may be arrange for simple one-level communication, for example, peer-to-peer communication. This can be termed "field level". It will be appreciated that peer-to-peer communication may also include: pole-to-pole (or column-to-column) communication if CoCo devices are used; luminaire-to-luminaire communication if LuCo devices are used; and pole-to-luminaire (or column-to-luminaire) if a mixture of CoCo and LuCo devices are used. Naturally, pole-to-luminaire (or column-to-luminaire) also includes luminaire-to-pole (or luminaire-to-column) communication.

As described above, each OLC device can store its real-time data, and because each luminaire has a unique geographical location, the actual power usage data can be linked with particular geographical location. In addition, as each OLC has an astronomical clock, sunrise and sunset times can be determined and used to switch the luminaire(s) either OFF or ON accordingly, if no other operating instructions are received. This means each OLC device has a failsafe mode which includes both ON and OFF rather than just simply ON or OFF.

Figure 5:
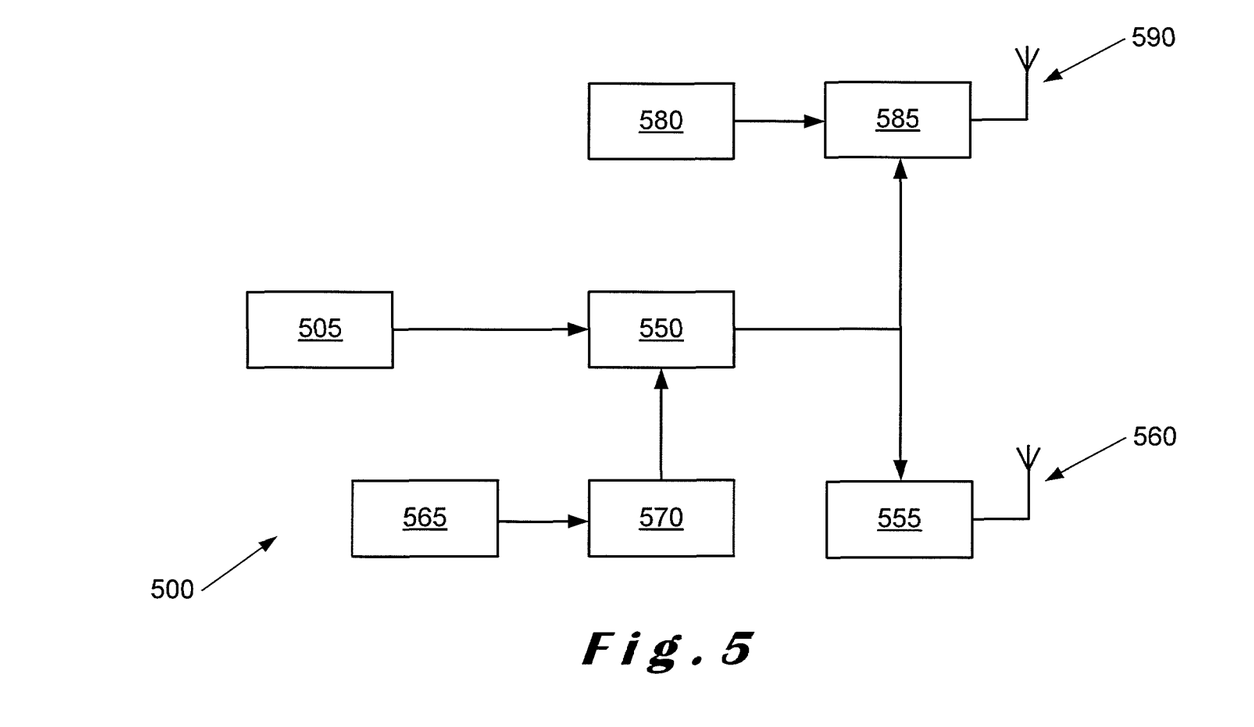
FIG. 5 illustrates a block diagram of an exemplary segment controller forming part of the lighting system shown in FIG. 1.

The SeCo device 170 of FIG. 1 is shown in more detail in FIG. 5. In FIG. 5, a SeCo device 500 comprises a multi-functional device including a transmission control protocol (TCP)/internet protocol (IP) gateway 555, 560 in accordance with ZigBee protocol, providing a security centre for both the ZigBee network and the TCP/IP gateway. It manages a segment of up to 150 OLC devices (not shown). The SeCo device 500 includes a general packet radio service (GPRS)/3rd generation mobile telecommunications (3G) modem 585 and antenna 590 which provides the required functionality of the TCP/IP gateway. Within a housing (not shown), a cellular antenna 590 is provided for connection to a mobile telecommunications network (also not shown). A suitable subscriber identity module (SIM) 580 is mounted within the housing and provides an interface between the mobile telecommunication network and an internet/ethernet connection.

A connection to a mains power supply 505 is provided for supplying power for a controller 550 and other electronics within the device. The SeCo device can be configured for mobile telecommunication via a web browser and internet connection. Similarly, the SeCo can be connected to ZigBee devices in the mesh network through the web browser and internet connection. As described above, the SeCo device serves as a dynamic host configuration protocol (DCHP) server through which an IP address is assigned to the device.

In addition, in a similar way to the OLC devices, the SeCo device 500 also includes an astronomical clock 565 connected to a timing circuit 570 to provide time synchronization and daylight saving time adjustments. The SeCo device 500 also serves as a group manager/web server for associated OLC devices, as it can collect data from associated OLC devices and provides a platform for interfacing with the central management system via an internet connection.

The SeCo device 500 collects data from each of the OLC devices in its segment by way of a self-healing ZigBee mesh network and transmits the data securely over the internet to the web server forming part of a virtual private network (VPN). The connection to the internet may be provided by GPRS and 3G as described above or it may be provided by an asymmetric digital subscriber line (ASDL). Equipped with two digital and two analogue inputs/outputs and a Modbus interface, the SeCo device can acquire data from a segment-side energy meter for billing purposes as well as send and receive commands from remote sensors and actuators, for example, switching a complete lighting feeder or receiving a ripple control command.

Modbus is a serial communications protocol which is the most commonly available means of connecting industrial electronic devices. This is because the protocol was developed with industrial application in mind; it is open and royalty-free; and it is easy to implement and maintain. Modbus allows for communication between up to 240 devices connected to the same network and is often used to connect a supervisory computer with a remote terminal unit in supervisory control and data acquisition (SCADA) systems. The Modbus protocol is managed by the Modbus Organization, a group of independent users and suppliers of automation devices.

The SeCo device is fully programmable if customization is needed. Light points can be organised in different groups, that is, intersections, main roads, crosswalks etc., each group receiving and executing switching and dimming commands synchronously. As described above, each SeCo device can manage up to 150 OLC devices in the field level and can be a communication interface between the these OLC devices and the management server application and the SQL-based database. Naturally, the SeCo device can be located in the wireless range of the OLC devices at the field level.

At the server level, both a scalable MySQL database and a web server application are provided. [MySQL is owned by MySQL AB, a Swedish company which is now a subsidiary of the Oracle Corporation.] Together these provide an easy to use graphical user interface (GUI) which can be accessed using a standard web browser, such as, Internet Explorer (developed by Microsoft Corporation), Firefox (developed by Mozilla Corporation), Safari (developed by Apple Inc.) etc. The server level can be located inside the IT infrastructure of a customer on a dedicated server.

All levels can cooperate in a wireless communication and management system that supports:

1. Continuous live data between the SeCo device and the field level with the SeCo device requesting data from the OLC devices with a maximum delay, for example, of 4 seconds. Continuous live data can be provided if a "monitoring section" is open in the GUI between the SeCo device level and the server level with a configurable update interval. A default update interval of 2 minutes is possible.
2. Data collection, such as, failure messages, energy values etc., can be stored at the SeCo level and uploaded to the server level, in particular, the database, on demand or in accordance with a predefined schedule. The system can be configured to handle updates of historical logged data, for example, every 60 minutes.
3. Field initiated communication requests which can be established between each SeCo device and the central management system.

The lighting system in accordance with the present disclosure can be commissioned and managed using a web browser. Using the web browser, it is possible to: locate and monitor specific lighting installations in geographic maps; access pre-defined reports; customise personal reports; configure the system; change dimming profiles or switching schedules etc. All information is stored on a SQL-based database making the data available for long-term evaluations, such as, energy analysis, lamp life time forecasting, problem detection etc.

The web browser has a home screen which has various views: a basic view which shows the status of the lighting system at the last query; an individual view which can be configured to provide a calendar function (providing a step back in time), to view special groups within the lighting system, or to view only special hardware within the lighting system; Google bubble information providing detailed information about a particular light point; and a monitoring, reporting and configuration view. [Google is a trademark of Google Inc.]

As part of the monitoring view, a navigation tree determines the view that is presented to a user, for example, "city level" providing a group configuration with manual commands on the group level; "street level" providing the status of all light points in relation to their geographical location; and "device level" providing detailed information relating to the ballast and/or lamp and the LuCo, CoCo and SeCo devices within the system.

As part of the reporting view, the navigation tree determines the view according to city, district and/or area levels and provides information relating to energy consumption and any errors within the reported city, district and/or area level. In addition, information relating to each light point is provided in detail, for example, energy consumption, switch on/off profiles, dimming profiles, errors etc.

The navigation tree for reporting provides the ability to select city, district and/or area and obtain information for energy usage and/or consumption as well as information relating to any errors. Similarly, for each light point, the energy usage and/or consumption and errors can be noted. In addition, detailed information relating to the energy, switch on/off times, and dimming profile can also be provided. The dimming profile is the different light levels associated with each luminaire during a 24-hour cycle, for example, ranging from high (100%) to low (20%) with levels in between in accordance with local conditions such as traffic etc.

Reports can be output in different formats in accordance with the specifications of the user of the lighting system, for example, reports may be output in hyper text mark-up language (HTML) format developed by the World Wide Web Consortium, portable document form a (PDF) provided by Adobe Systems Inc., comma-separated values (CSV) format, Microsoft Excel provided as part of Microsoft Office by Microsoft Inc., or any other suitable format supported by the SQL database. Information is available for a predetermined time period, for example, up to a maximum of 30 days. An overview of energy consumption can be provided for each device in the system in graphical form, broken down by days or other suitable time periods. Similarly, errors can be reported in the same way.

The central management system may be programmed to generate reports indicating malfunctions, monitoring and/or asset information. Reporting of malfunctions may include broken luminaires, lost nodes and communication problems; monitoring reporting may provide group, dim-level, switch ON/OFF times, energy consumption, electrical power, voltage, current etc.; and asset information reporting may provide information relating to individual luminaires and their operation.

As the lighting system of the present disclosure can be a "smart" or intelligent system, detailed reporting can be provided to enable better management of the system. Such reporting can be automatic and can be archived and/or e-mailed as desired. If there are problems, a suitable alarm notification can be provided by e-mail and/or by short message service (SMS). End of lifetime reporting can also be provided.

As part of the configuration view, the navigation tree determines configuration possibilities for "city level" in accordance with a group configuration. Districts and/or areas can be added or deleted, and, SeCo, CoCo and LuCo devices can be added, copied or deleted as required. Geographic Information System (GIS) software and geo-database management applications provided by Esri (Redlands, Calif., USA) may be used to provide geographical information of each group of devices and/or individual devices. Standard protocols for serving geo-referenced map images over the interne that are generated by a map server using data from a GIS database may also be used. In addition, file formats such as KML can be used to display geographic data in an Earth browser such as Google Earth, Google Maps, and Google Maps for mobile.

Administration can also be managed through the web browser, for example: user configurations including name, e-mail, access rights; role configuration including right assignment; language including the possibility to add or edit translation; tasks including the possibility of viewing and/or deleting active tasks using communication to the SeCo device; and properties including individual configuration of the web interface.

Individual operator information may also be configured as part of the properties of the web interface, including, for example, address, partner, legal representative, maps etc.

By having real-time power consumption data for, and real-time control of, an individual luminaire, control over a group of luminaires can be implemented using the actual data to optimize energy usage. Whilst actual metered power data is obtained for each luminaire, that data can be combined with other luminaires within the system to determine an energy usage profile for a particular group of luminaires or in a particular area. In addition, real-time metering provides greater accuracy and utility cost savings than using assumptions to determine the energy consumption or usage. As described above, real-time energy consumption for associated components of the luminaire, for example, the luminaire controller and LED drivers can also be determined.

Exemplary embodiments have been described with reference to specific luminaire controllers, namely, CoCo, LuCo and PiCo devices. It will, however, be appreciated, that the metering circuit of the present disclosure is not limited to use with such devices and may be implemented in any suitable luminaire controller.

Whilst particular embodiments have been described herein, it will be appreciated that the present invention is not limited to these embodiments and that other implementations are possible without departing from the scope and spirit of the invention.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

The invention claimed is:

1. A metering circuit for a luminaire connectable between a mains supply and a luminaire including a luminaire controller, the metering circuit comprising:
   a voltage measurement circuit providing a voltage output signal whose value is equal to the voltage measured at an input to the luminaire controller;

a current measurement circuit providing a current output signal whose value is equal to an accumulation of the current consumed by the luminaire and by the luminaire controller; and a processor connected to the voltage and current measurement circuits, the processor being configured for receiving the voltage and current output signals, for processing the received voltage and current output signals, and for providing signals representative of parameters derived from the voltage and current output signals, wherein the provided signals representative of parameters derived from the voltage and current output signals include combined energy consumption values of the luminaire and of the luminaire controller.

2. A metering circuit according to claim 1, comprising:
a power supply connected to the processor for providing power thereto.

3. A metering circuit according to claim 1, implemented as an integrated circuit.

4. A luminaire controller comprising:
a mains input module connectable to a mains supply;
a metering circuit connected to the mains input module, the metering circuit being configured for measuring voltage values and current values of the mains supply input connected to the mains input module, and for providing a voltage output signal whose value is equal to the voltage measured at the mains input module and a current output signal whose value is equal to an accumulation of current consumed by the luminaire controller and by the luminaire with which the luminaire controller is associated; and a central processing module connected to the metering circuit, the central processing module being configured for receiving the voltage and current output signals, for processing the received voltage and current output signals, and for providing signals representative of parameters derived from the voltage and current output signals, wherein the provided signals representative of parameters derived from the voltage and current output signals include combined metered energy consumption values of the mains supply connected to the mains input module.

5. A luminaire controller according to claim 4, comprising:
a memory for storing the metered values.

6. A luminaire controller according to claim 4, comprising:
a communications module connected to the central processing module, the communications module being operable for receiving the metered values from the central processing module and for transmitting the metered values to a remote location.

7. A luminaire controller according to claim 6, wherein the communications module comprises:
a wireless communications module.

8. A luminaire controller according to claim 7, wherein the wireless communications module operates in accordance with ZigBee protocol.

9. A luminaire controller according to claim 4, comprising:
a power supply module for supplying power control signals to the associated luminaire.

10. A luminaire controller according to claim 4, wherein the metering circuit comprises:
a voltage measurement module and a current measurement module, the measured parameters comprising respective voltage and current output signals.

11. A luminaire controller according to claim 10, wherein the metering circuit comprises:
a processor connected to the voltage and current measurement circuits to receive the voltage and current output signals, and to provide signals representative of parameters derived from the voltage and current output signals.

12. An energy metered lighting system comprising:
at least one luminaire;
a luminaire controller for controlling operation of each luminaire, each luminaire controller comprising:
a mains input module connectable to a mains supply;
a metering circuit connected to the mains input module, the metering circuit being operable for measuring voltage values and current values of the mains supply input connected to the mains input module, and for providing a voltage output signal whose value is equal to the voltage measured at an input of the luminaire controller and a current output signal whose value is an accumulation of the current consumed by the luminaire controller and by the luminaire with which the luminaire controller is associated;

a central processing module connected to the metering circuit, the central processing module being configured for receiving the voltage and current output signals, for processing the received voltage and current output signals, and for providing signals representative of parameters associated with the voltage and current output signals, and for providing metered values of the mains supply connected to the mains input module, wherein the provided signals representative of parameters associated with the voltage and current output signals include combined metered energy consumption values of the mains supply connected to the mains input module; and a communications module connected to the central processing module, the communications module being operable for receiving the metered values from the central processing module; and a management system operable for being wirelessly connected to each luminaire controller for receiving the metered values, the management system including a memory for storing the received metered values, and wherein the communications module is operable for transmitting the metered values to the management system.

13. An energy metered lighting system according to claim 12, wherein each luminaire controller is wirelessly connected to a segment controller for transmitting the metered values thereto, the segment controller being operable for collecting metered values from luminaire controllers within an associated segment and for transmitting the collected metered values to the management system.

14. An energy metered lighting system according to claim 12, comprising:
a web-based interface connectable to the management system via an internet connection, the web-based interface being operable for providing user access to the management system and for obtaining information relating to the lighting system therefrom.

15. An energy metered lighting system according to claim 13, wherein the associated segment includes a plurality of separately controlled luminaires with associated luminaire controllers.

* * * * *